United States Patent
Kim et al.

(10) Patent No.: US 8,023,358 B2
(45) Date of Patent: Sep. 20, 2011

(54) SYSTEM AND METHOD FOR PROVIDING A NON-POWER-OF-TWO BURST LENGTH IN A MEMORY SYSTEM

(75) Inventors: Kyu-hyoun Kim, Mount Kisco, NY (US); Paul W. Coteus, Yorktown, NY (US); Warren E. Maule, Cedar Park, TX (US); Kenneth L. Wright, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 311 days.

(21) Appl. No.: 12/061,045

(22) Filed: Apr. 2, 2008

(65) Prior Publication Data

US 2009/0251988 A1 Oct. 8, 2009

(51) Int. Cl.
*G11C 8/00* (2006.01)

(52) U.S. Cl. ............ 365/233.18; 365/233.1; 365/233.13; 714/767; 714/773

(58) Field of Classification Search ............ 365/233.1 X, 365/233.13 X, 233.18 O, 233.1, 233.13, 233.18; 714/763, 767 X, 773 X, 767, 773
See application file for complete search history.

(56) References Cited

U.S. PATENT DOCUMENTS

| | | | |
|---|---|---|---|
| 5,513,135 A | 4/1996 | Dell et al. | |
| 5,740,188 A * | 4/1998 | Olarig | 714/763 |
| 5,922,080 A * | 7/1999 | Olarig | 714/767 |
| 6,349,390 B1 * | 2/2002 | Dell et al. | 714/6 |
| 6,381,685 B2 | 4/2002 | Dell et al. | |
| 7,050,340 B1 * | 5/2006 | Ruckerbauer et al. | 365/191 |
| 7,075,851 B2 * | 7/2006 | Tanaka | 365/230.06 |
| 7,096,407 B2 * | 8/2006 | Olarig | 714/768 |
| 7,447,974 B2 * | 11/2008 | Klein | 714/754 |
| 7,644,342 B2 * | 1/2010 | Shibata | 714/773 |

OTHER PUBLICATIONS

IBM, DDR4 CRC Format Proposal, JEDEC, Sep. 12, 2007, 8 pages.

* cited by examiner

*Primary Examiner* — VanThu Nguyen
(74) *Attorney, Agent, or Firm* — Cantor Colburn LLP (57) ABSTRACT

A memory system, memory interface device and method for a non-power-of-two burst length are provided. The memory system includes a plurality of memory devices with non-power-of-two burst length logic and a memory interface device including non-power-of-two burst length generation logic. The non-power-of-two burst length generation logic extends a burst length from a power-of-two value to insert an error-detecting code in a burst on data lines between the memory interface device and the plurality of memory devices.

20 Claims, 9 Drawing Sheets

FIG. 9

SYSTEM AND METHOD FOR PROVIDING A NON-POWER-OF-TWO BURST LENGTH IN A MEMORY SYSTEM

BACKGROUND OF THE INVENTION

This invention relates generally to computer memory, and more particularly to providing a non-power-of-two burst length in a memory system.

Contemporary high performance computing memory systems utilize error-detecting codes, such as parity bits or cyclic redundancy checks to detect occasional random bit errors. Other memory systems incorporate error correcting codes (ECC) to both detect and correct bit errors. As data rates increase in memory systems, error codes need to be transmitted along with data to ensure data integrity and high reliability. However, this increases the total number of bits transferred for each memory access, and thus, typically requires additional I/O pins or lanes and corresponding module/board signal traces and connector pins. Additional I/O pins increase overall memory system cost and may also result in additional failure modes. Therefore, it would be beneficial to send error-detecting codes bits without increasing the number of I/O pins.

Typical dynamic random access memory (DRAM) utilizes bursting in power-of-two lengths to improve data bandwidth. For example, double data rate one (DDR1) synchronous DRAM (SDRAM) may have a burst length of 2, DDR2 SDRAM may have a burst length of 4, and DDR3 SDRAM may have a burst length of 8, where each burst accesses data at locations relative to a specified memory address. It would be advantageous to develop an approach to modify memory system bursting to accommodate both data and error-detecting codes on the same data lines without reducing data bandwidth. Accordingly, there is a need in the art for providing a non-power-of-two burst length in a memory system.

BRIEF SUMMARY OF THE INVENTION

An exemplary embodiment is a memory system including a plurality of memory devices with non-power-of-two burst length logic and a memory interface device including non-power-of-two burst length generation logic. The non-power-of-two burst length generation logic extends a burst length from a power-of-two value to insert an error-detecting code in a burst on data lines between the memory interface device and the plurality of memory devices.

Another exemplary embodiment is a memory interface device for controlling a plurality of memory devices. The memory interface device includes logic for writing data to the memory devices using a write burst on data lines with a non-power-of-two write burst length, and reading data from the memory devices using a read burst on the data lines with a non-power-of-two read burst length. The memory interface device further includes logic for inserting an error-detecting code in the write burst on the data lines, and receiving the error-detecting code in the read burst on the data lines.

A further exemplary embodiment is a method for providing a non-power-of-two burst length in a memory system. The method includes extending a burst length from a power-of-two value to insert an error-detecting code in a burst on data lines between a memory interface device and a plurality of memory devices.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

The invention as described herein utilizes a non-power-of-two burst length in a memory system to provide error-detecting code information on data lines of memory devices rather than utilizing dedicated lines for error-detecting codes. In an exemplary embodiment, command-to-command timing for memory accesses is extended to provide a window to insert error-detecting code information on data lines as part of a burst. For example, extending a dynamic random access memory (DRAM) burst length from eight to ten allows a burst on data lines to include eight data bits and two additional error-detecting code bits per data line as part of the same burst associated with a read or write command for one or more memory devices. Constraining read and write command sequences at a memory interface device, such as a memory controller, as well as at the memory devices can provide a window for inserting information beyond a typical power-of-two data burst length.

In an alternate embodiment, the command-to-command timing remains the same between a power-of-two and a non-power-of-two burst length but the clock frequency for the memory device accesses is modified. For instance, increasing the clock frequency by twenty percent can provide one or more additional clock cycles between memory access commands while maintaining the same command-to-command timing. Using double data rate (DDR) synchronous dynamic random access memory (SDRAM), a burst length of ten bits is transferred in five clock cycles with four clock cycles for data and one clock cycle for error-detecting code information on the data lines.

In another embodiment, existing timing bubbles in memory system designs are utilized to insert error-detecting code information into a burst without modifying command-to-command timing or clock frequency. Modern DRAM (e.g., DDR2 SDRAM and DDR3 SDRAM) does not achieve the maximum possible peak bandwidth due to timing restrictions, such as a four-bank activation window limit (tFAW) that constrains row activation timing. Therefore, DRAM may exhibit an average data bandwidth of only about 80% of the peak bandwidth. This means that there is a potential bubble or gap period between data on the data bus. By using this invention, the bubbles are filled with error-detecting codes without affecting average data bandwidth and without using any additional pins. Error-detecting codes may include cyclic redundancy checks (CRCs), parity bits, error correcting codes (ECCs), error detection and correction codes (EDACs), or other error detection coding schemes known in the art.

When the burst length of a memory access is extended to a non-power-of-two length, a further consider is adjusting timing to account for potential alignment issues. As an example, 10 bits may be transferred within 2.5 clock cycles when quad rate signaling is used. In another example, a single error-detecting code bit included with a data burst of 8 bits results in a burst length of 9. For seamless access, such as read followed by read or write followed by write, the second burst of read/write data may be delayed by half clock cycle to maintain timing relative to the previous read/write data burst. In one embodiment, insertion of delays for commands is determined by monitoring command sequences as a distance between consecutive commands relative to the burst length. In another embodiment, an unused bit, such as a row address bit while performing column reads or writes to memory, is used to signal whether to delay an associated memory access command by a predetermined value. Further details regarding the invention are provided herein.

Figure 1:
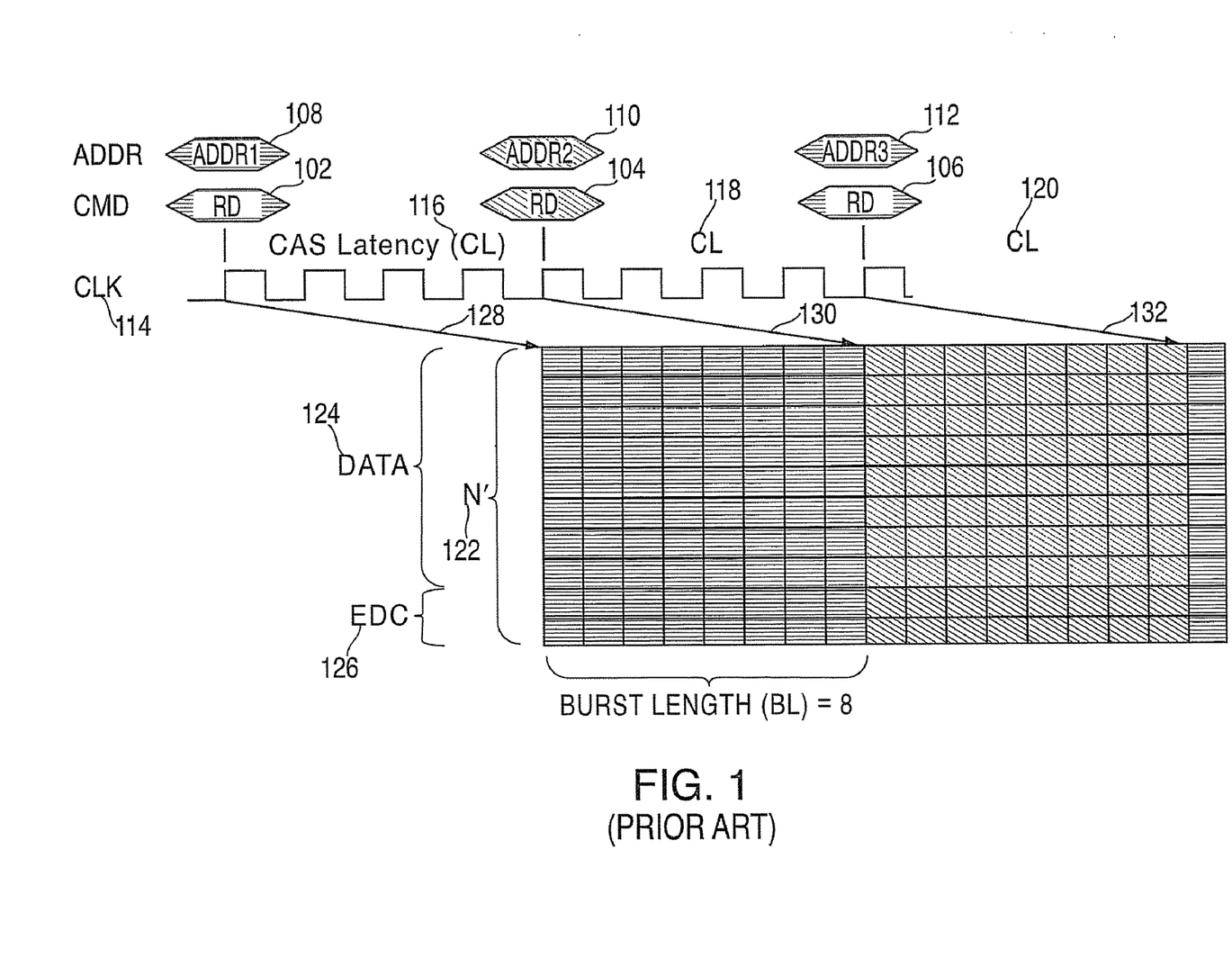
FIG. 1 depicts an example of a prior art timing of memory access commands with a burst length of eight.

Turning now to the figures, it will be seen that FIG. 1 depicts an example of a prior art timing of memory access commands with a burst length of eight. Three consecutive read commands 102, 104, and 106 at addresses 108, 110, and 112 are performed as three sequential bursts. A clock signal 114 is depicted along with column access latency (CL) 116, 118, and 120 for each associated read command 102, 104, and 106. The CLs 116-120 represent access delays between a memory device receiving a command and responding with associated data and error-detecting code (EDC) bits. N' 122 represents a bus width of 10, with 8 data lines 124 and 2 EDC lines 126. In the example depicted in FIG. 1, each of the read commands 102-106 results in a burst length of 8 across the 10-bit bus of N' 122. Arrows 128, 130, and 132 point to the first bits of each burst associated with the read commands 102-106. It will also be seen in FIG. 1 that the relationship between bits and each clock period is 2-to-1 (i.e., DDR). Thus, issuing commands on every fourth clock cycle results in a burst of eight bits per line.

Figure 2:
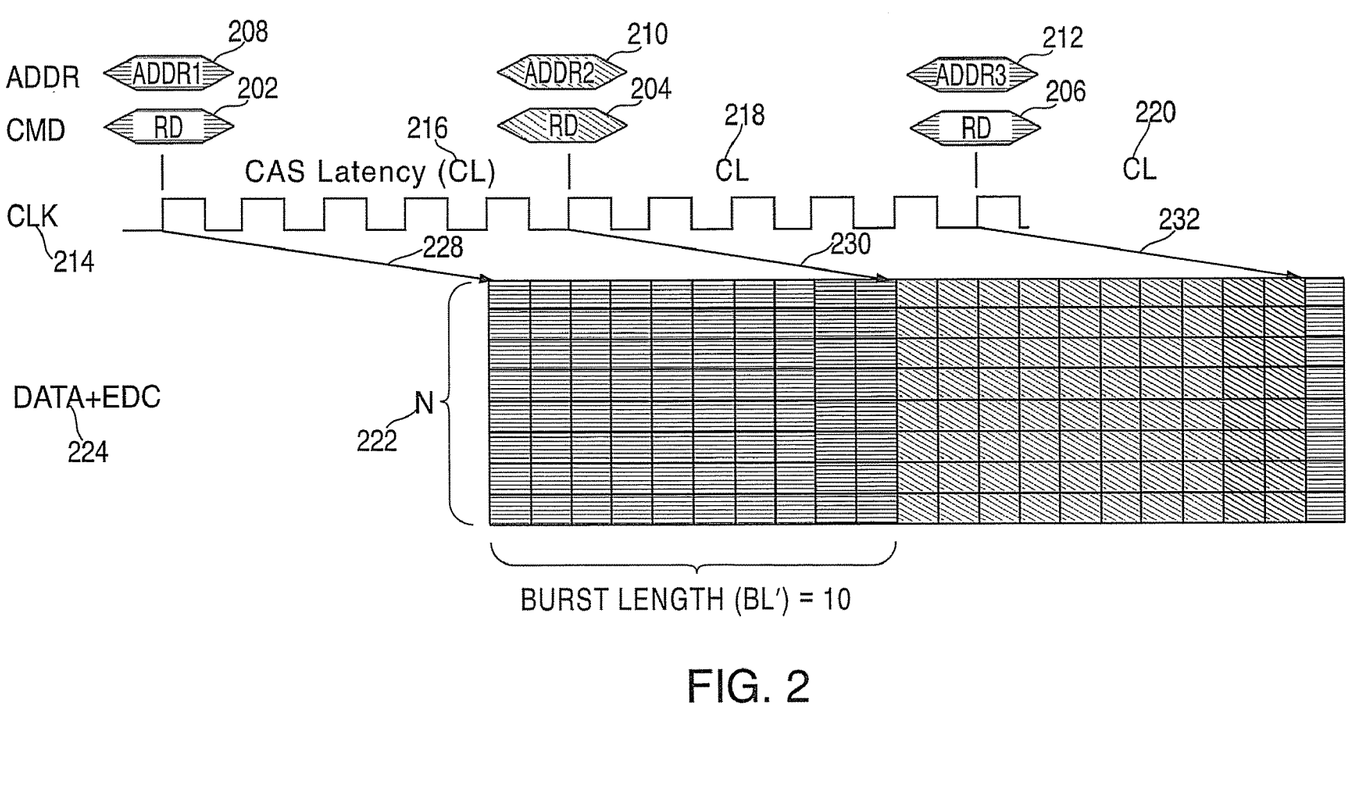
FIG. 2 depicts an exemplary timing of memory access commands with a burst length of ten that may be implemented by exemplary embodiments.

FIG. 2 depicts an exemplary timing of memory access commands with a burst length of ten that may be implemented by an exemplary embodiment of the present invention. Three consecutive read commands 202, 204, and 206 at addresses 208, 210, and 212 are performed as three sequential bursts. However, in comparison with FIG. 1, the read commands 202-206 of FIG. 2 are 5 cycles of clock 214 apart versus 4 clock cycles between the read commands 102-106 of FIG. 1. The non-power-of-two number of clock cycles between the read commands 202-206 results in a non-power-of-two burst length of ten, since the relationship between bits and each clock period is 2-to-1 (i.e., DDR). The two additional bits per burst of FIG. 2 allows error-detecting code information to be included in the burst along with the same number of data bits per burst, thus eliminating the need for additional dedicated EDC lines on the bus. CLs 216, 218, and 220 represent access delays between a memory device receiving a command and responding with associated data and EDC bits. N 222 represents a bus width of 8, with 8 data lines 224 that are also used to send EDC bits as part of the same burst. In the example depicted in FIG. 2, each of the read commands 202-206 results in a burst length of 10 across the 8-bit bus of N 222. Arrows 228, 230, and 232 point to the first bits of each burst associated with the read commands 202-206.

Figure 3:
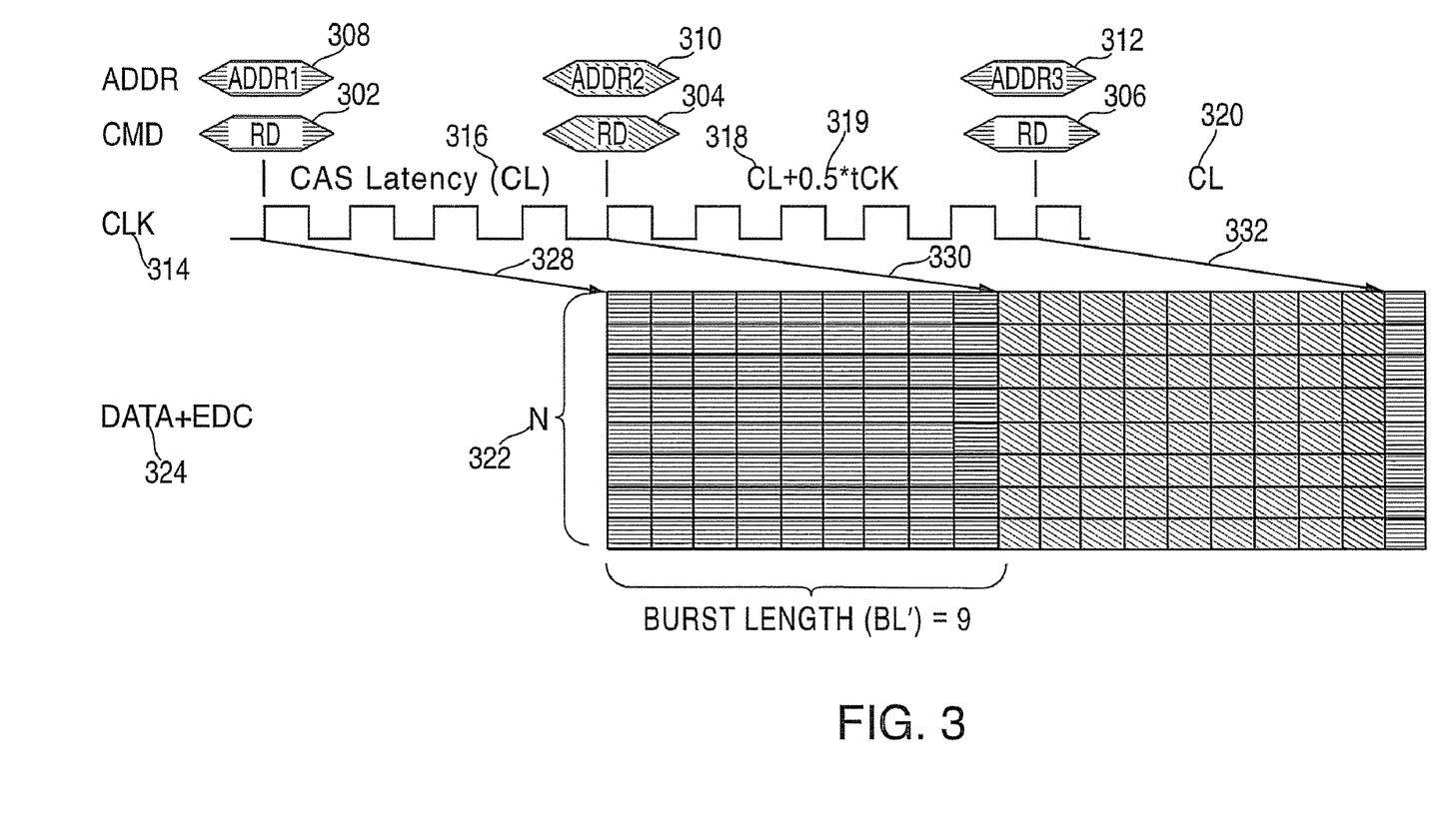
FIG. 3 depicts an exemplary timing of memory access commands with a burst length of nine that may be implemented by exemplary embodiments.

FIG. 3 depicts an exemplary timing of memory access commands with a burst length of nine that may be implemented by an exemplary embodiment of the present invention. Three consecutive read commands 302, 304, and 306 at addresses 308, 310, and 312 are performed as three sequential bursts. Since the relationship between bits and each clock period is 2-to-1 (i.e., DDR), a burst length of nine results in an overlap of two bursts in single clock cycle using a non-power-of-two burst length. Although clock 314 is the same frequency as the clock 214 of FIG. 2, the timing between the read commands 302-306 varies. In order to keep the read commands 302-306 aligned with a rising edge of the clock 314, a half cycle delay is utilized which appears as a full cycle delay between every other read command. For example, there are 4 cycles of the clock 314 between the read commands 302 and 304 to account for CL 316, while 5 cycles of the clock 314 exist between the read commands 304 and 306 to account for CL 318 plus delay 319 (0.5*tCK). Four cycles of the clock 314 can be utilized after the read command 306 to account for CL 320. N 322 represents a bus width of 8, with 8 data lines 324 that are also used to send EDC bits as part of the same burst. In the example depicted in FIG. 3, each of the read commands 302-306 results in a burst length of 9 across the 8-bit bus of N 322. Arrows 328, 330, and 332 point to the first bits of each burst associated with the read commands 302-306.

Figure 4:
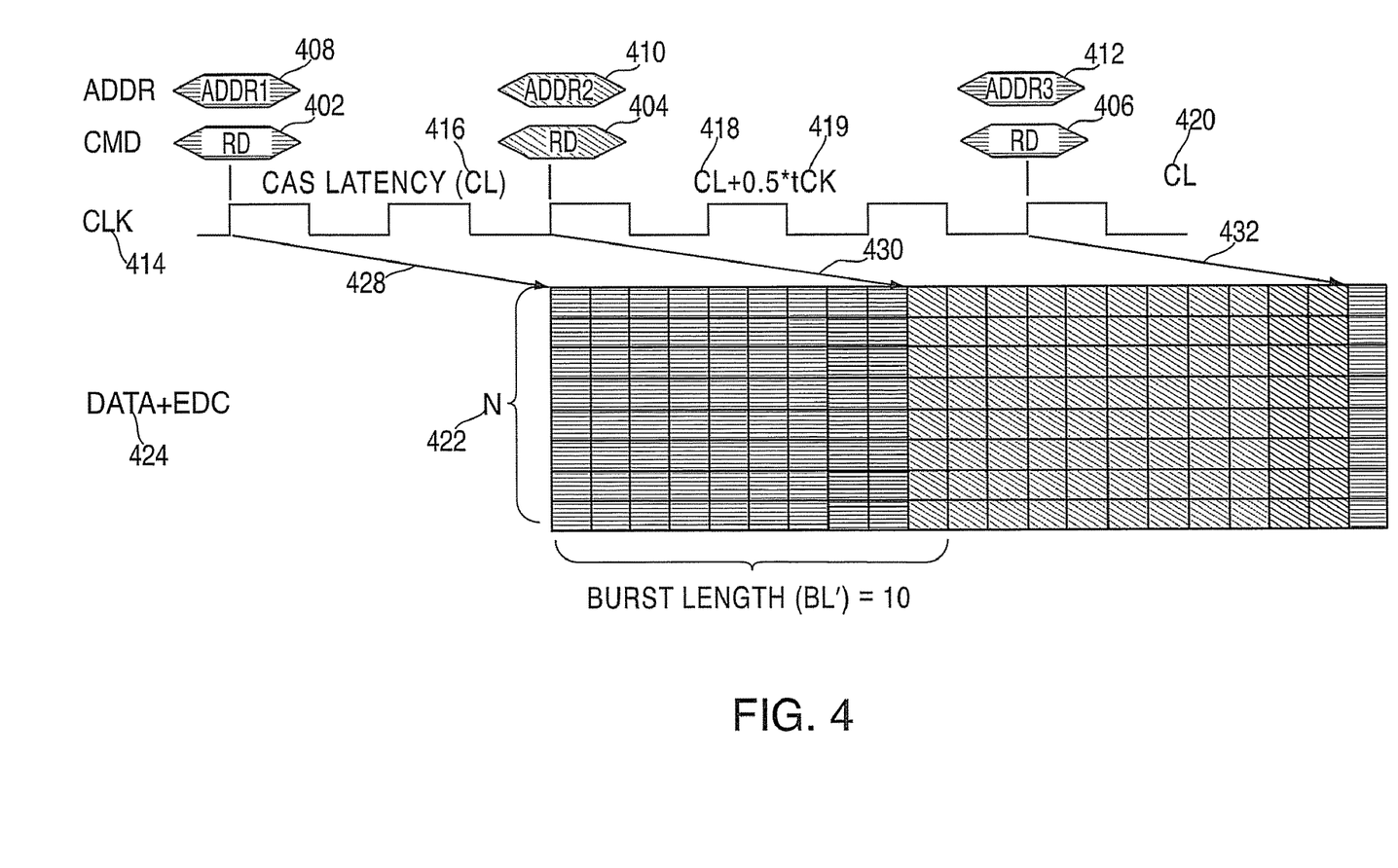
FIG. 4 depicts an exemplary timing of memory access commands with a burst length of ten using a quad data rate that may be implemented by exemplary embodiments.

FIG. 4 depicts an exemplary timing of memory access commands with a burst length of ten using a quad data rate that may be implemented by an exemplary embodiment. Three consecutive read commands 402, 404, and 406 at addresses 408, 410, and 412 are performed as three sequential bursts. Here the relationship between bits and each clock period is 4-to-1 (i.e., a quad data rate), and a burst length of ten results in an overlap of two bursts in single clock cycle using a non-power-of-two burst length. Clock 414 is half of the frequency of clock 214 in FIG. 2, requiring variable timing between the read commands 402-406 in similar fashion to that described in reference to FIG. 3. In order to keep the read commands 402-406 aligned with a rising edge of the clock 414, a half cycle delay is utilized which appears as a full cycle delay between every other read command. For example, there are 2 cycles of the clock 414 between the read commands 402 and 404 to account for CL 416, while 3 cycles of the clock 414 exist between the read commands 404 and 406 to account for CL 418 plus delay 419 (0.5*tCK). Two cycles of the clock 414 can be utilized after the read command 406 to account for CL 420. N 422 represents a bus width of 8, with 8 data lines 424 that are also used to send EDC bits as part of the same burst. In the example depicted in FIG. 4, each of the read commands 402-406 results in a burst length of 10 across the 8-bit bus of N 422. Arrows 428, 430, and 432 point to the first bits of each burst associated with the read commands 402-406.

Figure 5:
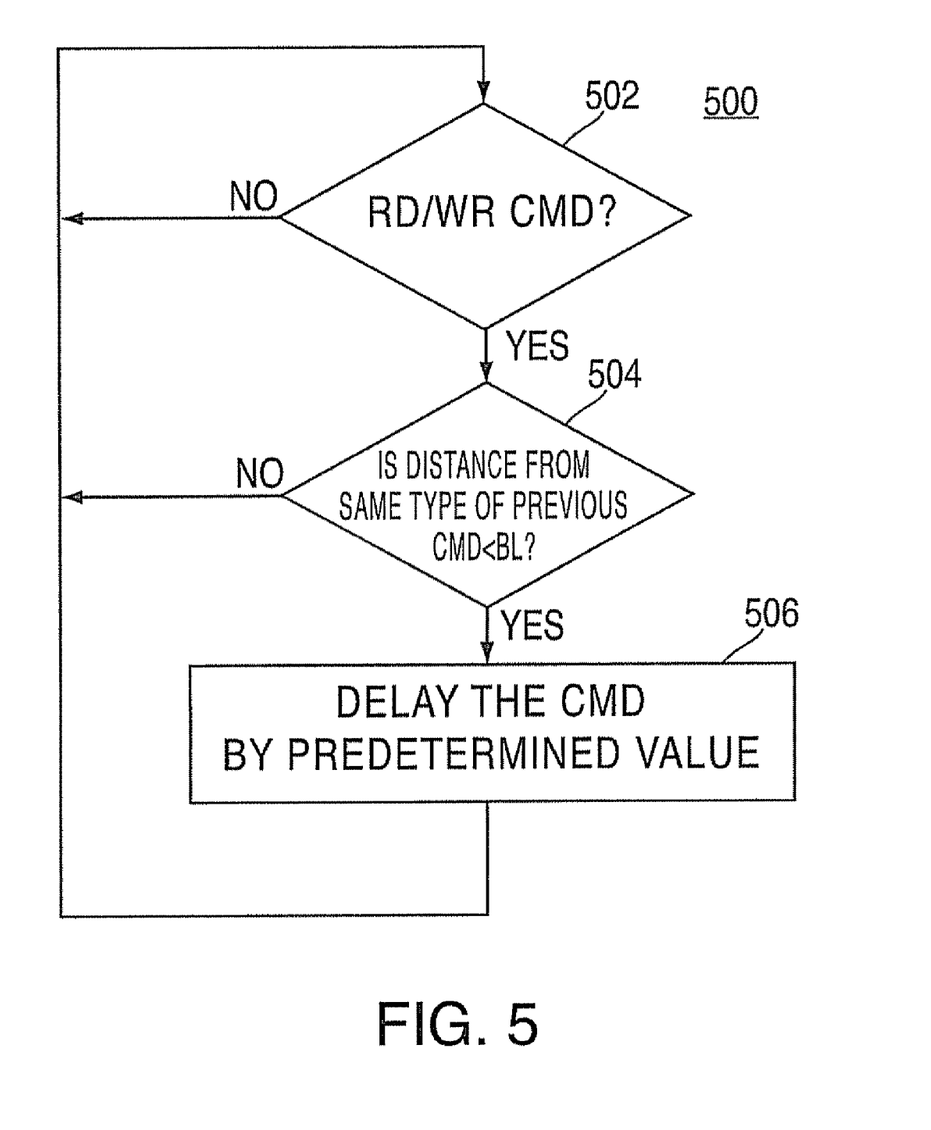
FIG. 5 depicts a process for providing a non-power-of-two burst length in a memory system that may be implemented by exemplary embodiments.

FIG. 5 depicts a process 500 for providing a non-power-of-two burst length in a memory system that may be implemented by an exemplary embodiment. The process 500 may be implemented in memory devices to delay commands issued by a memory interface device such as a memory controller or a hub device. At block 502, a check is performed to determine whether a read or a write command has been received. Once a read or write command is received, a check is performed at block 504 to determine whether the distance from the same type of previous command is less than the burst length. The distance value may be determined in bit time intervals or partial clock cycles. For example, as depicted in FIG. 3, the distance between read command 302 and read command 304 is 4 cycles of the clock 314, which is equivalent to 8 bit intervals. Since the burst length is 9 for the example of FIG. 3, the process 500 would advance to block 506 (i.e., distance of 8 bit intervals <burst length of 9 for consecutive read commands 302 and 304). At block 506, the current command is delayed by a predetermined value. Continuing with the example of FIG. 3, read command 304 is delayed by delay 319, which is equivalent to half of a cycle of the clock 314. Delaying processing of the read command 304 provides an additional bit interval to extend the burst length from 8 to 9 for inserting EDC information on the data lines. Since the distance between read commands 304 and 306 is 5 cycles of the clock 314 (equivalent to 10 bit intervals), no delay is required for the read command 306.

Figure 6:
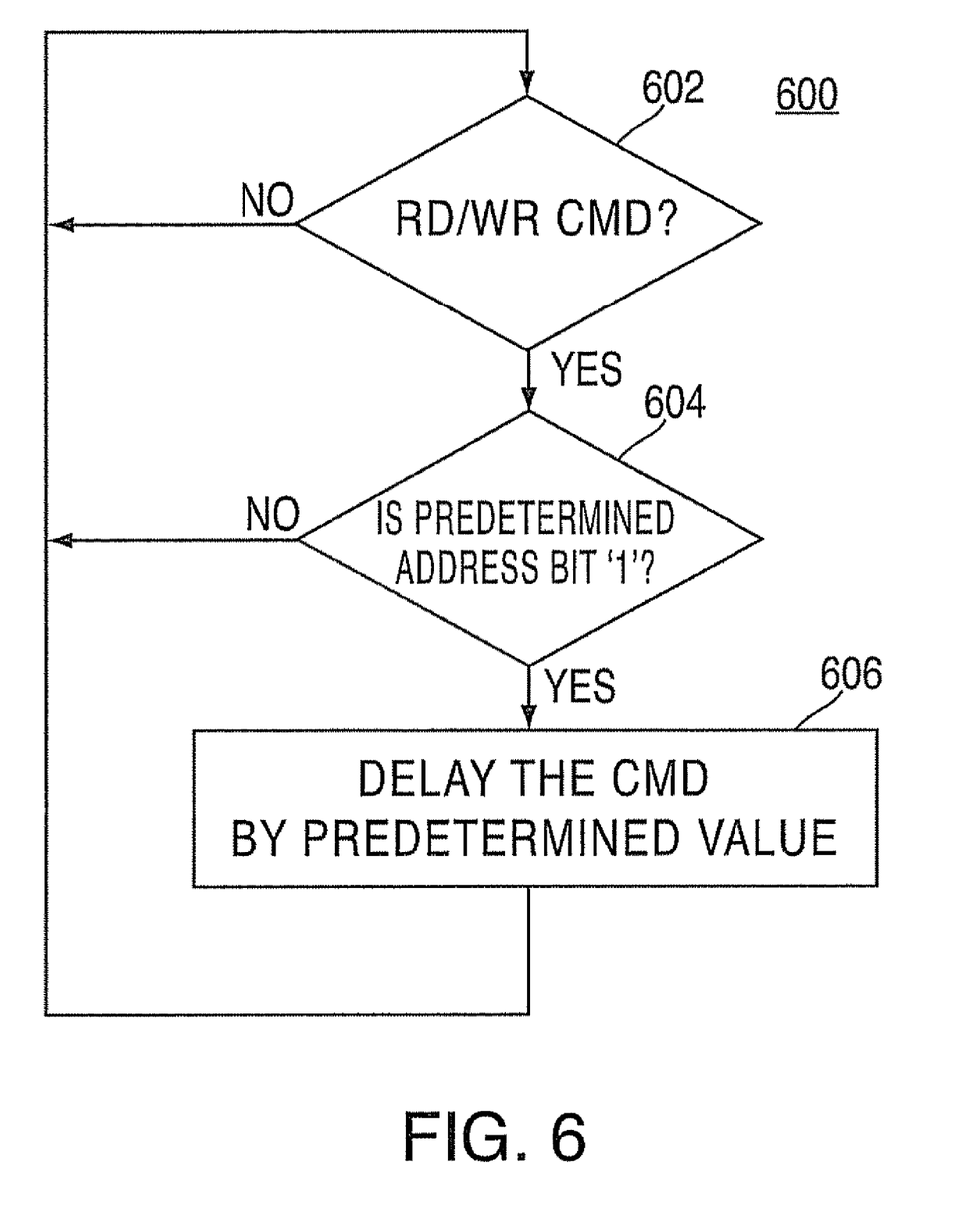
FIG. 6 depicts an alternate process for providing a non-power-of-two burst length in a memory system that may be implemented by exemplary embodiments.

FIG. 6 depicts an alternate process 600 for providing a non-power-of-two burst length in a memory system that may be implemented by an exemplary embodiment. Similar to the process 500 of FIG. 5, the process 600 may be implemented in memory devices to delay commands issued by a memory interface device such as a memory controller or a hub device. At block 602, a check is performed to determine whether a read or a write command has been received. Once a read or write command is received, a check is performed at block 604 to determine whether an unused signal, such as a predetermined address bit, is set. The unused signal may be unused in reference to the current command, but be used for other commands. For example, a row access address bit may be used during row accesses to a memory device but not during column accesses to the memory device. Therefore, when implemented for column accesses, the process 600 can utilize a row access address bit as the predetermined address bit of block 604. Similar to block 506 of FIG. 5, at block 606 the current command is delayed by a predetermined value in response to block 604 determining that it is time to delay. The process 600 may simplify logic at the memory devices since distance tracking relative to multiple memory access commands is not performed.

Figure 7:
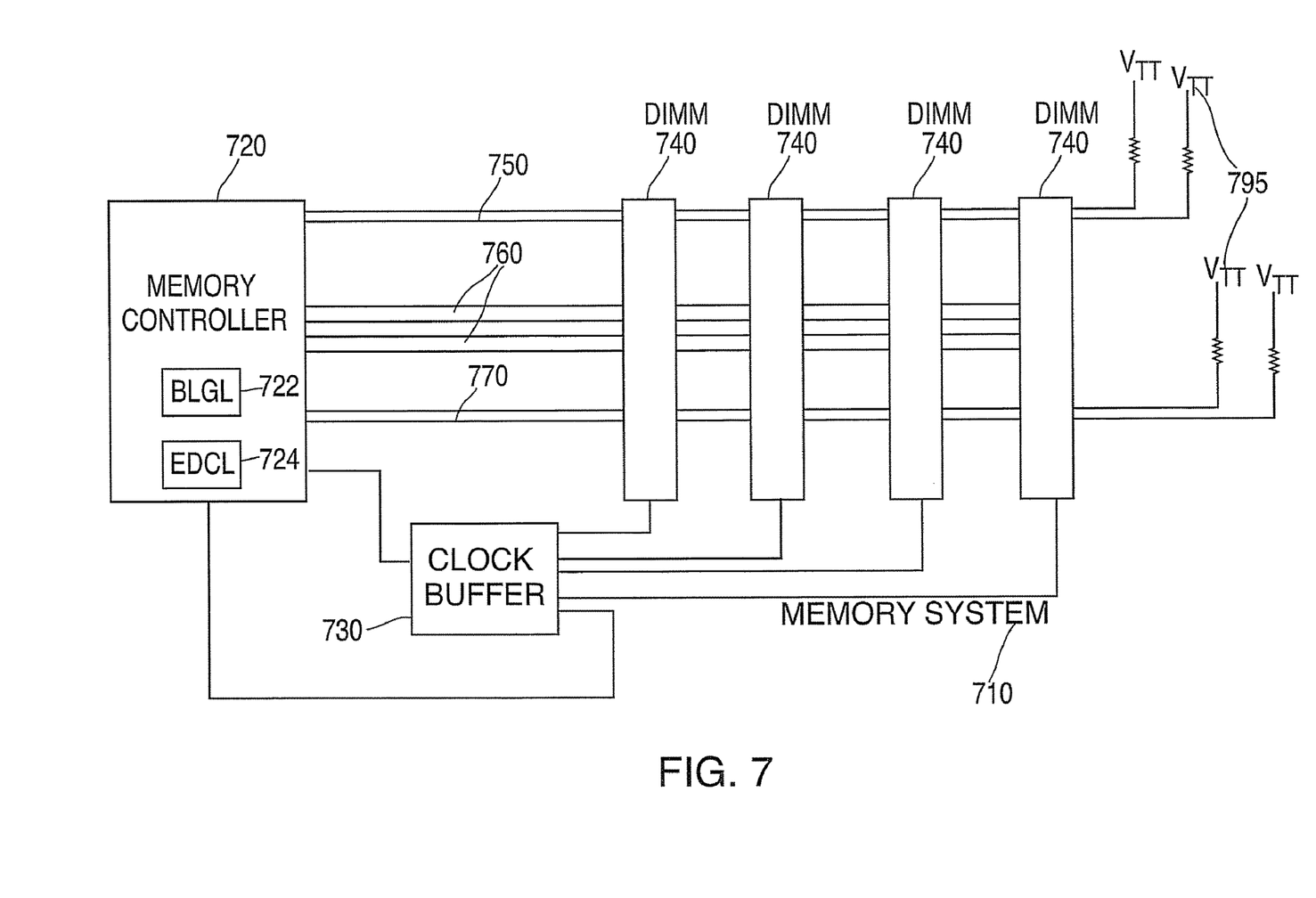
FIG. 7 depicts a memory system that includes DIMMs on a traditional multi-drop stub bus and that utilizes a non-power-of-two burst length that may be implemented by exemplary embodiments.

FIG. 7 depicts a simplified diagram and description of a memory system 710 that includes up to four dual in-line memory modules (DIMMs) 740 on a traditional multi-drop stub bus, which may implement non-power-of two burst lengths. The system includes a memory controller 720, an external clock buffer 730, DIMMs 740, an address bus 750, a control bus 760 and a data bus 770 with terminators 795 on the address bus 750 and the data bus 770. The memory controller 720 is a memory interface device that includes the use of a non-power-of-two burst length as described herein in reference to FIGS. 2-6. The non-power-of-two burst length is supported in both the memory devices of the DIMMs 740 and the memory controller 720. For example, the memory devices on the DIMMs 740 may incorporate the process 500 of FIG. 5 or the process 600 of FIG. 6 to incorporate timing delays in support of non-power-of-two burst lengths.

The memory controller 720 includes burst length generation logic (BLGL 722) and error-detecting code logic (EDCL) 724. The BLGL 722 extends a burst length from a power-of-two value to insert an error-detecting code in a burst on data lines of the data bus 770. The BLGL 722 can adjust burst length by increasing a number of clock cycles between sequential memory commands, and may vary the number of clock cycles between sequential commands to account for uneven relationships between clock cycles and burst lengths. In one embodiment, the BLGL 722 notifies memory devices on the DIMMs 740 as to when to insert a delay via adjusting a value of a predetermined address bit on address bus 750. In another embodiment, memory devices on the DIMMs 740 monitor timing and command sequences to determine when to delay commands. The BLGL 722 may increase the clock frequency through the external clock buffer 730 in the memory system 710 to extend a burst length from a power-of-two value to a non-power-of-two value. Alternatively, the memory controller 720 can insert the error-detecting code in a preexisting gap period (also referred to as a bubble) occurring between sequential memory commands (e.g., spare time attributable to tFAW constraint). The EDCL 724 can generate or extract the error-detecting code, such as a parity value, CRC, ECC, or EDAC, for a non-power-of-two length burst. The BLGL 722 and/or the EDCL 724 may be implemented by hardware and/or software.

Although only a single memory channel is shown in FIG. 7, systems produced with these modules often included more than one discrete memory channel from the memory controller, with each of the memory channels operated singly (when a single channel was populated with modules) or in parallel (when two or more channels where populated with modules) to achieve the desired system functionality and/or performance.

Figure 8:
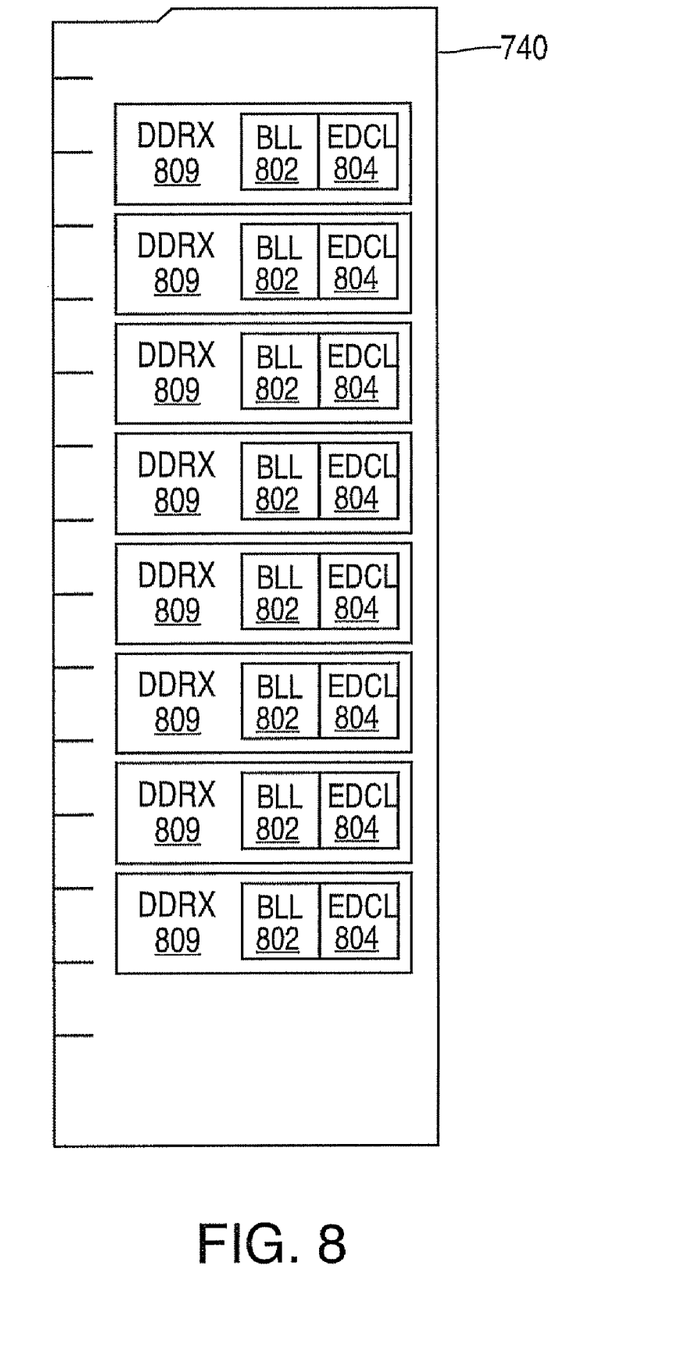
FIG. 8 depicts memory devices on a DIMM utilizing a non-power-of-two burst length that may be implemented by exemplary embodiments.

FIG. 8 depicts memory devices on one of the DIMMs 740 of FIG. 7. In an exemplary embodiment, burst length logic (BLL) 802 and error-detecting code logic (EDCL) 804 are included in each of the memory devices 809. The memory devices 809 may be DDR memory, such as DDR1 SDRAM, DDR2 SDRAM, DDR3 SDRAM, DDR4 SDRAM, and the like (depicted generically as DDRX). The BLL 802 includes logic for timing and delay control (e.g., using processes 500 or 600 of FIGS. 5 and 6) that functions in conjunction with a memory interface device, such as the memory controller 720 of FIG. 7. The BLL 802 may handle both power-of-two burst lengths of data and non-power-of-two burst lengths of data plus EDC bits. The EDCL 804 handles determining specific error-detecting codes, e.g., a CRC, as well as responding to a detected error. In an alternate embodiment, the EDCL 804 calculates error-detecting codes but the memory interface device handles error detection and correction. In another embodiment, the EDCL 804 extracts the error-detecting code from a non-power-of-two write burst on the data lines and inserts the error-detecting code in a non-power-of-two read burst on the data lines. It will be understood that the DIMM 740 of FIG. 8 depicts merely an exemplary arrangement of memory devices supporting non-power-of-two burst lengths. Other arrangements may include single in-line memory modules (SIMMs), ranked DIMMs, registered DIMMs, and other memory device organization formats known in the art.

Figure 9:
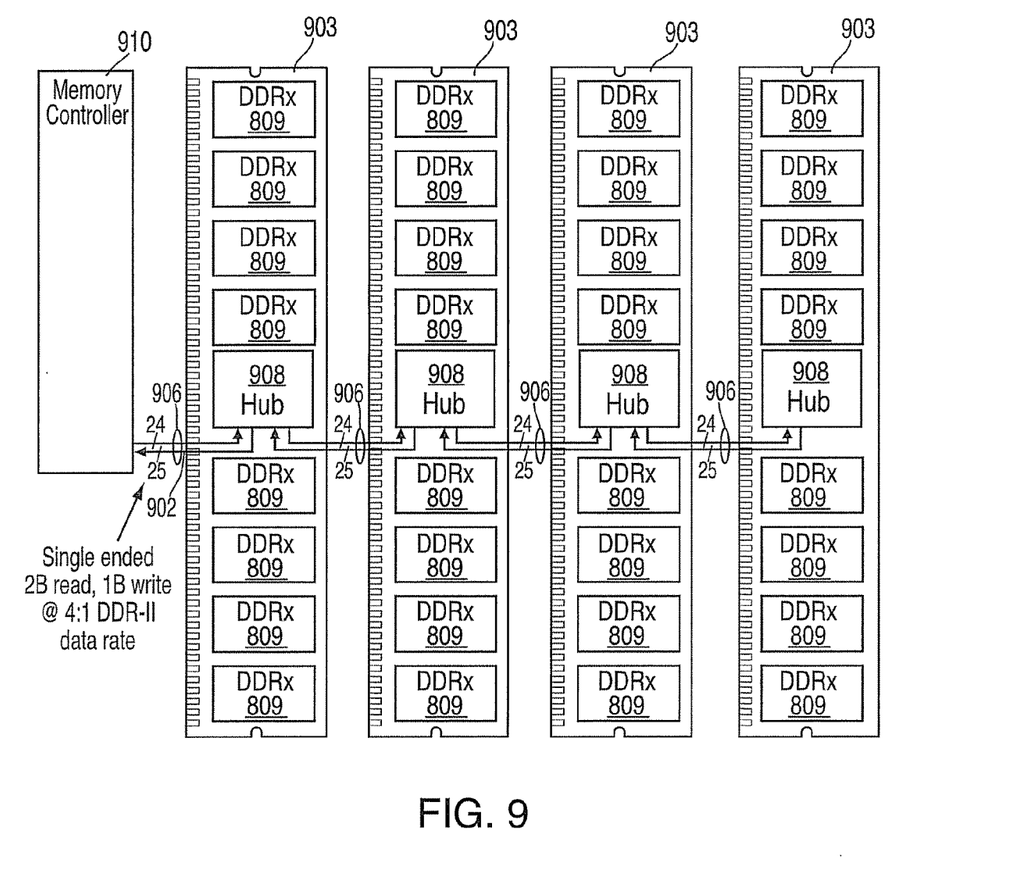
FIG. 9 depicts a cascade interconnect memory system with unidirectional busses that utilizes a non-power-of-two burst length that may be implemented by exemplary embodiments.

FIG. 9 depicts a memory structure with cascaded memory modules 903 and unidirectional busses 906. One of the functions provided by hub devices 908 in the memory modules 903 in the cascade structure is a re-drive function to send signals on the unidirectional busses 906 to other memory modules 903 or to the memory controller 910. FIG. 9 includes the memory controller 910 and four memory modules 903, on each of two memory busses 906 (a downstream memory bus with 24 wires and an upstream memory bus with 25 wires), connected to the memory controller 910 in either a direct or cascaded manner. The memory module 903 next to the memory controller 910 is connected to the memory controller 910 in a direct manner. The other memory modules 903 are connected to the memory controller 910 in a cascaded manner. Although not shown in this figure, the memory controller 910 may be integrated in a processor and may connect to more than one memory bus 906. As depicted in FIG. 9, the hub devices 908 are a type of memory interface device and may include the use of the BLGL 722 and EDCL 724 as described in reference to FIG. 7, which may be implemented by hardware and/or software.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Exemplary embodiments include a computing system with a processor(s) and an I/O unit(s) (e.g., requesters) interconnected to a memory system that contains a memory controller and memory devices. In exemplary embodiments, the memory system includes a processor or memory controller interfaced to a set of hub devices (also referred to as "hub chips"). The hub devices connect and interface to the memory devices via signals which include clock signals. In exemplary embodiments the computer memory system includes a physical memory array with a plurality of memory devices for storing data and instructions. These memory devices may be connected directly to the memory controller and/or indirectly coupled to the memory controller through hub devices. In exemplary embodiments, the hub-based computer memory system has memory devices attached to a communication hub device that is connected to a memory control device (e.g., a memory controller). Also in exemplary embodiments, the hub device is located on a memory module (e.g., a single substrate or physical device) that includes two or more hub devices that are cascaded interconnected to each other (and possibly to another hub device located on another memory module) via the memory bus.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device translates the memory access requests to control the memory devices to store write data from the hub device or to provide read data to the hub device. Read data is encoded into one or more communication packet(s) and transmitted through the memory bus(ses) to the memory controller.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links to connect to one or more hub chips and/or memory devices.

The memory modules may be implemented by a variety of technology including a DIMM, a single in-line memory module (SIMM) and/or other memory module or card structures. In general, a DIMM refers to a small circuit board which is comprised primarily of random access memory (RAM) integrated circuits or die on one or both sides with signal and/or power pins on both sides of the board. This can be contrasted to a SIMM, which is a small circuit board or substrate composed primarily of RAM integrated circuits or die on one or both sides and single row of pins along one long edge. DIMMs have been constructed with pincounts ranging from 100 pins to over 300 pins. In exemplary embodiments described herein, memory modules may include two or more hub devices.

In exemplary embodiments, the memory bus is constructed using multi-drop connections to hub devices on the memory modules and/or using point-to-point connections. The downstream portion of the controller interface (or memory bus), referred to as the downstream bus, may include command, address, data and other operational, initialization or status information being sent to the hub devices on the memory modules. Each hub device may simply forward the information to the subsequent hub device(s) via bypass circuitry; receive, interpret and re-drive the information if it is determined to be targeting a downstream hub device; re-drive some or all of the information without first interpreting the information to determine the intended recipient; or perform a subset or combination of these options.

The upstream portion of the memory bus, referred to as the upstream bus, returns requested read data and/or error, status or other operational information, and this information may be forwarded to the subsequent hub devices via bypass circuitry; be received, interpreted and re-driven if it is determined to be targeting an upstream hub device and/or memory controller in the processor complex; be re-driven in part or in total without first interpreting the information to determine the intended recipient; or perform a subset or combination of these options.

In alternate exemplary embodiments, the point-to-point bus includes a switch or bypass mechanism which results in the bus information being directed to one of two or more possible hub devices during downstream communication (communication passing from the memory controller to a hub device on a memory module), as well as directing upstream information (communication from a hub device on a memory module to the memory controller), often by way of one or more upstream hub devices. Further embodiments include the use of continuity modules, such as those recognized in the art, which, for example, can be placed between the memory controller and a first populated hub device (i.e., a hub device that is in communication with one or more memory devices), in a cascade interconnect memory system, such that any intermediate hub device positions between the memory controller and the first populated hub device include a means by which information passing between the memory controller and the first populated hub device can be received even if the one or more intermediate hub device position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include main memory storage devices.

In exemplary embodiments, the memory system includes one or more hub devices on one or more memory modules connected to the memory controller via a cascade interconnect memory bus, however other memory structures may be implemented such as a point-to-point bus, a multi-drop memory bus or a shared bus. Depending on the signaling methods used, the target operating frequencies, space, power, cost, and other constraints, various alternate bus structures may be considered. A point-to-point bus may provide the optimal performance in systems produced with electrical interconnections, due to the reduced signal degradation that may occur as compared to bus structures having branched signal lines, switch devices, or stubs. However, when used in systems requiring communication with multiple devices or subsystems, this method will often result in significant added component cost and increased system power, and may reduce the potential memory density due to the need for intermediate buffering and/or re-drive.

Although not shown in the Figures, the memory modules or hub devices may also include a separate bus, such as a 'presence detect' bus, an I2C bus and/or an SMBus which is used for one or more purposes including the determination of the hub device an/or memory module attributes (generally after power-up), the reporting of fault or status information to the system, the configuration of the hub device(s) and/or memory subsystem(s) after power-up or during normal operation or other purposes. Depending on the bus characteristics, this bus might also provide a means by which the valid completion of operations could be reported by the hub devices and/or memory module(s) to the memory controller(s), or the identification of failures occurring during the execution of the main memory controller requests.

Performances similar to those obtained from point-to-point bus structures can be obtained by adding switch devices. These and other solutions offer increased memory packaging density at lower power, while retaining many of the characteristics of a point-to-point bus. Multi-drop busses provide an alternate solution, albeit often limited to a lower operating frequency, but at a cost/performance point that may be advantageous for many applications. Optical bus solutions permit significantly increased frequency and bandwidth potential, either in point-to-point or multi-drop applications, but may incur cost and space impacts.

As used herein the term "buffer" or "buffer device" refers to a temporary storage unit (as in a computer), especially one that accepts information at one rate and delivers it another. In exemplary embodiments, a buffer is an electronic device that provides compatibility between two signals (e.g., changing voltage levels or current capability). The term "hub" is sometimes used interchangeably with the term "buffer." A hub is a device containing multiple ports that is connected to several other devices. A port is a portion of an interface that serves a congruent I/O functionality (e.g., a port may be utilized for sending and receiving data, address, and control information over one of the point-to-point links, or busses). A hub may be a central device that connects several systems, subsystems, or networks together. A passive hub may simply forward messages, while an active hub, or repeater, amplifies and refreshes the stream of data which otherwise would deteriorate over a distance. The term hub device, as used herein, refers to a hub chip that includes logic (hardware and/or software) for performing memory functions.

Also as used herein, the term "bus" refers to one of the sets of conductors (e.g., wires, and printed circuit board traces or connections in an integrated circuit) connecting two or more functional units in a computer. The data bus, address bus and control signals, despite their names, constitute a single bus since each are often useless without the others. A bus may include a plurality of signal lines, each signal line having two or more connection points, that form a main transmission path that electrically connects two or more transceivers, transmitters and/or receivers. The term "bus" is contrasted with the term "channel" which is often used to describe the function of a "port" as related to a memory controller in a memory system, and which may include one or more busses or sets of busses. The term "channel" as used herein refers to a port on a memory controller. Note that this term is often used in conjunction with I/O or other peripheral equipment, however the term channel has been adopted by some to describe the interface between a processor or memory controller and one of one or more memory subsystem(s).

Further, as used herein, the term "daisy chain" refers to a bus wiring structure in which, for example, device A is wired to device B, device B is wired to device C, etc. The last device is typically wired to a resistor or terminator. All devices may receive identical signals or, in contrast to a simple bus, each device may modify one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors or optical carriers, generally configured as a single carrier or as two or more carriers, in a twisted, parallel, or concentric arrangement, used to transport at least one logical signal.

Memory devices are generally defined as integrated circuits that are composed primarily of memory (storage) cells, such as DRAMs (Dynamic Random Access Memories), SRAMs (Static Random Access Memories), FeRAMs (Ferro-Electric RAMs), MRAMs (Magnetic Random Access Memories), Flash Memory and other forms of random access and related memories that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs or any of the expected follow-on devices such as DDR2, DDR3, DDR4 and related technologies such as Graphics RAMs, Video RAMs, LP RAM (Low Power DRAMs) which are often based on the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package or even integrated onto a single device—based on technology, power, space, cost and other tradeoffs. In addition, one or more of the various passive devices such as resistors, capacitors may be integrated into the support chip packages, or into the substrate, board or raw card itself, based on technology, power, space, cost and other tradeoffs. These packages may include an integrated heat sink or other cooling enhancements, which may be further attached to the immediate carrier or another nearby carrier or heat removal system.

Memory devices, hubs, buffers, registers, clock devices, passives and other memory support devices and/or components may be attached to the memory subsystem and/or hub device via various methods including solder interconnects, conductive adhesives, socket structures, pressure contacts and other methods which enable communication between the two or more devices via electrical, optical or alternate means.

The one or more memory modules (or memory subsystems) and/or hub devices may be electrically connected to the memory system, processor complex, computer system or other system environment via one or more methods such as soldered interconnects, connectors, pressure contacts, conductive adhesives, optical interconnects and other communication and power delivery methods. Connector systems may include mating connectors (male/female), conductive contacts and/or pins on one carrier mating with a male or female connector, optical connections, pressure contacts (often in conjunction with a retaining mechanism) and/or one or more of various other communication and power delivery methods. The interconnection(s) may be disposed along one or more edges of the memory assembly and/or placed a distance from an edge of the memory subsystem depending on such application requirements as ease-of-upgrade/repair, available space/volume, heat transfer, component size and shape and other related physical, electrical, optical, visual/physical access, etc. Electrical interconnections on a memory module are often referred to as contacts, or pins, or tabs. Electrical interconnections on a connector are often referred to as contacts or pins.

As used herein, the term memory subsystem refers to, but is not limited to: one or more memory devices; one or more memory devices and associated interface and/or timing/control circuitry; and/or one or more memory devices in conjunction with a memory buffer, hub device, and/or switch. The term memory subsystem may also refer to one or more memory devices, in addition to any associated interface and/or timing/control circuitry and/or a memory buffer, hub device or switch, assembled into a substrate, a card, a module or related assembly, which may also include a connector or similar means of electrically attaching the memory subsystem with other circuitry. The memory modules described herein may also be referred to as memory subsystems because they include one or more memory devices and hub devices.

Additional functions that may reside local to the memory subsystem and/or hub device include write and/or read buffers, one or more levels of memory cache, local pre-fetch logic, data encryption/decryption, compression/decompression, protocol translation, command prioritization logic, voltage and/or level translation, error detection and/or correction circuitry, data scrubbing, local power management circuitry and/or reporting, operational and/or status registers, initialization circuitry, performance monitoring and/or control, one or more co-processors, search engine(s) and other functions that may have previously resided in other memory subsystems. By placing a function local to the memory subsystem, added performance may be obtained as related to the specific function, often while making use of unused circuits within the subsystem.

Memory subsystem support device(s) may be directly attached to the same substrate or assembly onto which the memory device(s) are attached, or may be mounted to a separate interposer or substrate also produced using one or more of various plastic, silicon, ceramic or other materials which include electrical, optical or other communication paths to functionally interconnect the support device(s) to the memory device(s) and/or to other elements of the memory or computer system.

Information transfers (e.g. packets) along a bus, channel, link or other naming convention applied to an interconnection method may be completed using one or more of many signaling options. These signaling options may include such methods as single-ended, differential, optical or other approaches, with electrical signaling further including such methods as voltage or current signaling using either single or multi-level approaches. Signals may also be modulated using such methods as time or frequency, non-return to zero, phase shift keying, amplitude modulation and others. Voltage levels are expected to continue to decrease, with 1.5V, 1.2V, 1V and lower signal voltages expected consistent with (but often independent of) the reduced power supply voltages required for the operation of the associated integrated circuits themselves.

One or more clocking methods may be utilized within the memory subsystem and the memory system itself, including global clocking, source-synchronous clocking, encoded clocking or combinations of these and other methods. The clock signaling may be identical to that of the signal lines themselves, or may utilize one of the listed or alternate methods that is more conducive to the planned clock frequency (ies), and the number of clocks planned within the various subsystems. A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the subsystem, or may be based on a clock that is derived from the clock related to the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and other functional, configuration or related information. Information passing from the memory subsystem(s) may include any or all of the information passing to the memory subsystem(s), however generally will not include address and command information. This information may be communicated using communication methods that may be consistent with normal memory device interface specifications (generally parallel in nature), the information may be encoded into a 'packet' structure, which may be consistent with future memory interfaces or simply developed to increase communication bandwidth and/or enable the subsystem to operate independently of the memory technology by converting the received information into the format required by the receiving device(s).

Initialization of the memory subsystem may be completed via one or more methods, based on the available interface busses, the desired initialization speed, available space, cost/complexity objectives, subsystem interconnect structures, the use of alternate processors (such as a service processor) which may be used for this and other purposes, etc. In one embodiment, the high speed bus may be used to complete the initialization of the memory subsystem(s), generally by first completing a training process to establish reliable communication, then by interrogation of the attribute or 'presence detect' data associated the various components and/or characteristics associated with that subsystem, and ultimately by programming the appropriate devices with information associated with the intended operation within that system. In a cascaded system, communication with the first memory subsystem would generally be established, followed by subsequent (downstream) subsystems in the sequence consistent with their position along the cascade interconnect bus.

A second initialization method would include one in which the high speed bus is operated at one frequency during the initialization process, then at a second (and generally higher) frequency during the normal operation. In this embodiment, it may be possible to initiate communication with all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency (ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic included in each of these subsystems.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also offers the advantage of providing an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) will help facilitate increased function on integrated devices as well as the integration of functions previously implemented on separate devices. This integration will serve to improve overall performance of the intended function, as well as promote increased storage density, reduced power, reduced space requirements, lower cost and other manufacturer and customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC, ECC, EDAC, parity or other encoding/decoding methods suited for this purpose. Further reliability enhancements may include operation re-try (to overcome intermittent faults such as those associated with the transfer of information), the use of one or more alternate or replacement communication paths to replace failing paths and/or lines, complement-re-complement techniques or alternate methods used in computer, communication and related systems.

The use of bus termination, on busses as simple as point-to-point links or as complex as multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage or another signal. The termination device(s) may be part of a passive or active termination structure, and may reside in one or more positions along one or more of the signal lines, and/or as part of the transmitter and/or receiving device(s). The terminator may be selected to match the impedance of the transmission line, or selected via an alternate approach to maximize the useable frequency, operating margins and related attributes within the cost, space, power and other constraints.

Technical effects and benefits include removal of dedicated error-detecting code lines by providing error-detecting code information on data lines as part of a non-power-of-two burst with read or write data. Reducing the number of lines between a memory interface device and memory devices can lower overall cost and power consumption, among other benefits.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is clamed is:

1. A memory system comprising:
a plurality of memory devices, each of the memory devices including non-power-of-two burst length logic and error-detection logic for calculating an error-detecting code; and
a memory interface device including non-power-of-two burst length generation logic, wherein the non-power-of-two burst length generation logic extends a burst length from a power-of-two value to a non-power-of-two value to insert the error-detecting code calculated by each of the memory devices in a burst on data lines between the memory interface device and the plurality of memory devices.

2. The memory system of claim 1 wherein the error-detection logic extracts the error-detecting code from a non-power-of-two write burst on the data lines and inserts the error-detecting code in a non-power-of-two read burst on the data lines.

3. The memory system of claim 1 wherein the error-detecting code is one of: a parity value, cyclic redundancy check (CRC), an error correcting code (ECC), and an error detection and correction code (EDAC).

4. The memory system of claim 1 wherein the burst length is adjusted by increasing a number of clock cycles between sequential memory commands.

5. The memory system of claim 4 wherein a delay is selectively inserted between the sequential memory commands.

6. The memory system of claim 5 wherein the memory devices determine an insertion position of the delay as one of:
a comparison of a distance between memory commands of a same type in relation to the burst length; and
a value of an address bit.

7. The memory system of claim 1 wherein the burst length is adjusted by increasing a clock frequency in the memory system.

8. The memory system of claim 1 wherein the error-detecting code is inserted in a preexisting gap period occurring between sequential memory commands.

9. A memory interface device for controlling a plurality of memory devices, the memory interface device including logic for facilitating:
extending a burst length from a power-of-two value to a non-power-of-two value;
writing data to the memory devices using a write burst on data lines with a non-power-of-two write burst length, the writing comprising inserting an error-detecting code in the write burst on the data lines; and
reading data from the memory devices using a read burst on the data lines with a non-power-of-two read burst length, the reading comprising receiving the error-detecting code in the read burst on the data lines, the error-detecting code calculated by error-detection logic located on each of the memory devices.

10. The memory interface device of claim 9 wherein the error-detecting code is one of a parity value, cyclic redundancy check (CRC), an error correcting code (ECC), and an error detection and correction code (EDAC).

11. The memory interface device of claim 9 wherein one of the read burst length and the write burst length is established via increasing a number of clock cycles between sequential memory commands.

12. The memory interface device of claim 11 wherein a delay is selectively inserted between the sequential memory commands.

13. The memory interface device of claim 9 wherein one of the read burst length and the write burst length is established via increasing a clock frequency in the memory system in relation to a power-of-two burst length.

14. The memory interface device of claim 9 wherein the error-detecting code is inserted in a preexisting gap period occurring between sequential memory commands.

15. A method for providing a non-power-of-two burst length in a memory system, the method comprising:
extending a burst length from a power-of-two value to a non-power-of-two value to insert an error-detecting code in a burst on data lines between a memory interface device and a plurality of memory devices, wherein the error-detecting code is calculated by error-detection logic located on each of the memory devices.

16. The method of claim 15 further comprising:
extracting the error-detecting code from a non-power-of-two write burst on the data lines; and
inserting the error-detecting code in a non-power-of-two read burst on the data lines.

17. The method of claim 15 wherein the burst length is adjusted by increasing a number of clock cycles between sequential memory commands.

18. The method of claim 17 wherein a delay is selectively inserted between the sequential memory commands, and the memory devices determine an insertion position of the delay as one of:
   a comparison of a distance between memory commands of the same type in relation to the burst length; and
   a value of an address bit.

19. The method of claim 15 wherein the burst length is adjusted by increasing a clock frequency in the memory system.

20. The method of claim 15 wherein the error-detecting code is inserted in a preexisting gap period occurring between sequential memory commands.

* * * * *